United States Patent [19]

Robinson

[11] Patent Number: 5,811,322

[45] Date of Patent: Sep. 22, 1998

[54] METHOD OF MAKING A BROADBAND BACKSIDE ILLUMINATED MESFET WITH COLLECTING MICROLENS

[75] Inventor: Gerald D. Robinson, Lompoc, Calif.

[73] Assignee: W. L. Gore & Associates, Inc., Newark, Del.

[21] Appl. No.: 679,880

[22] Filed: Jul. 15, 1996

[51] Int. Cl.[6] .................................................. H01L 21/84
[52] U.S. Cl. .............................. 438/92; 438/98; 438/149; 438/160; 438/167; 438/406; 438/459; 438/977
[58] Field of Search .................................. 438/77, 92, 93, 438/98, 149, 158, 167, 173, 175, 160, 176, 177, 603, 403, 406, 456, 459, 977, 928, 181, 198, 246, 423; 257/187, 182, 290, 294, 459, 460, 462

[56] References Cited

U.S. PATENT DOCUMENTS

| 4,980,308 | 12/1990 | Hayashi et al. | 438/977 |
| 5,075,237 | 12/1991 | Wu | 437/2 |
| 5,508,802 | 12/1996 | Mayer et al. | 438/459 |
| 5,532,173 | 7/1996 | Martin et al. | 438/92 |
| 5,557,120 | 9/1996 | Martin et al. | 257/291 |
| 5,608,255 | 3/1997 | Martin et al. | 257/187 |
| 5,663,075 | 9/1997 | Robinson | 438/977 |

FOREIGN PATENT DOCUMENTS 63-90859  4/1988  Japan.

*Primary Examiner*—Charles L. Bowers, Jr.
*Assistant Examiner*—Leon Radomsky
*Attorney, Agent, or Firm*—Victor M. Genco, Jr.

[57] ABSTRACT

A composite-layer semiconductor device includes a gate above a host substrate, an n++ contact layer above the gate, and source and drain ohmic contacts applied to the n++ contact layer. The source and drain ohmic contacts define a central gate location which is recessed through the n++ contact layer toward the gate. The source and drain ohmic contacts create a barrier to chemical etching so that a current path below the central gate location can be incrementally recessed in repeated steps to precisely tailor the operating mode of the device for depletion or enhancement applications. The composite-layer semiconductor device is fabricated by depositing a gate on an n++ contact layer above a semi-insulating substrate. The semi-insulating substrate and gate are flipped onto an epoxy layer on the host substrate so that the gate is secured to the epoxy layer and the semi-insulating substrate presents an exposed backside. A portion of the exposed backside is removed. The source and drain ohmic contacts are applied to the exposed backside. The exposed backside is recessed at the central gate location to define the current path which connects the source and drain ohmic contacts.

13 Claims, 5 Drawing Sheets

METHOD OF MAKING A BROADBAND BACKSIDE ILLUMINATED MESFET WITH COLLECTING MICROLENS

FIELD OF THE INVENTION

This invention relates generally to composite-layer semiconductor devices, and more particularly to a broadband backside illuminated MESFET with a light collecting microlens.

BACKGROUND OF THE INVENTION

In the conventional processing procedure for a gallium arsenide (GaAs) MESFET shown in FIG. 1, the starting material is a semi-insulating ("SI") single-crystal gallium arsenide substrate 12. An active region n-type layer 14 and an n+ layer 16, are usually molecular beam epitaxially ("MBE") grown or multiple selectively ion implanted. Mesa structures are etched to the SI substrate 12 or selectively proton implanted for isolation of a particular MESFET device.

Nickel/12% germanium-88% gold/nickel/gold, Ni/GeAu/Ni/Au, ohmic contacts 18, 20 are vacuum deposited and alloyed to form a source and a drain. Refractory metal ohmic contacts, e.g., germanium/molybdenum/tungsten, Ge/Mo/W, may also be used for high temperature (i.e., >200° C.) operation. Multiple selective ion implantation may also be used to form such source and drain contacts 18, 20, followed by ohmic metal as described above.

The area between source 18 and drain 20 is usually chemically removed through n+ layer 16 into n-type layer 14, and the Shottky barrier gate metal 22 is vacuum deposited.

A conventional GaAs MESFET deteriorates rapidly above 125° C. as a result of gold diffusion from source and drain ohmic contacts 18, 20 into active region 14. The incorporation of refractory ohmic contacts may be used to eliminate this problem. Operation speed, noise, maximum operating temperature and efficiency of conventional MESFETs are limited due to the structure of a conventional GaAs MESFET. Speed, gain and noise are affected by the distance carriers must travel in the current path 24 between source 18 and drain 20, and by the RC constants inherent in the conventional GaAs MESFET structure. These constraints require the ultimate in design, alignment and dimensional control for fabrication.

There is no ability to tailor the depletion or enhancement mode characteristics of a completed conventional GaAs MESFET. The position of gate 22 in a conventional GaAs MESFET precludes any further modification of current channel 24. The light sensitivity of the conventional MESFET is limited since the light can only enter the device in the constrained areas between gate 22 and source 18, and gate 22 and drain 20, which limits the effectiveness of the conventional GaAs MESFET as a photoreceiver. Moreover, the maximum operating temperature of the device is limited to the temperature sensitivity of the intrinsic carriers in the SI GaAs substrate, which is usually about 125°–150° C.

A previous phototransistor invented by Gerald D. Robinson to solve the problem of the temperature sensitivity of the intrinsic carriers in an SI GaAs substrate is illustrated in FIG. 2. In this arrangement the semi-insulating GaAs substrate of a conventional MESFET is removed to alleviate temperature sensitivity and make the phototransistor more robust. The previous phototransistor and a method of making such phototransistor is described in detail in copending U.S. application Ser. No. 08/274,931 entitled "BACKSIDE ILLUMINATED FET OPTICAL RECEIVER AND METHOD WITH GALLIUM ARSENIDE SPECIES" by Gerald D. Robinson, which is incorporated by reference as if fully set forth herein. The previous phototransistor illustrated in FIG. 2 is created from a typical FET structure grown above an AlAs layer above a semi-insulating GaAs substrate. A MESFET is then fabricated using conventional procedures, such as described with reference to FIG. 1. The MESFET is then flipped upside-down and bonded, gate side down, using a thermally-conductive and electrically-insulative high temperature epoxy 32, onto an arbitrary substrate 36 such as aluminum nitride (AlN), aluminum oxide ($Al_2O_3$), sapphire, etc. The GaAs semi-insulating substrate 38 is lapped to a thickness of approximately 100 microns. The remaining GaAs is removed, stopping at the AlAs layer 40, using reactive ion etching ("RIE") with Freon 12, $CCl_2F_2$, or equivalent, etchant gas. As a result of the flipping, the backside of the fabricated MESFET is exposed. An active layer mesa from the GaAs substrate remains in the center of the exposed backside after the RIE treatment. A Schottky barrier gate 42 consisting of Ti, Pt, and Au, is thus positioned below the thin (approx 0.15 micron) active layer 38 of GaAs. The gate 42 and the source and drain ohmic contacts 44, 46 to the n+ GaAs 48 are below the gate.

The previous phototransistor avoids some of the shortcomings of conventional GaAs MESFETs. This previous phototransistor, invented by Gerald D. Robinson, works without degradation to 250° C. and has a high degree of light sensitivity because most of the thin exposed backside over the gate is removed. Removal of semi-insulating substrate 38 increases the maximum operating temperature of the previous phototransistor to greater than 300° C., and also makes the previous phototransistor an effective photoreceiver because light can impinge directly on the thin exposed backside above gate 42.

However, some deficiencies associated with conventional MESFETs exist in the previous phototransistor. The transit time for carriers to flow in the current path 49 from the source to the drain is still relatively long. The RC constants inherent in the conventional GaAs MESFET have not been eliminated by the design of the previous phototransistor. The previous phototransistor is bandwidth limited to the photosensitivity of the GaAs layer, which is in a range from 0.6–0.9 mm wavelength. The speed, noise and gain of conventional MESFETs (FIG. 1) and the previous phototransistor (FIG. 2) are primarily limited by the carrier transit time in the current path from the source to the drain and the inherent RC constants of the devices.

SUMMARY OF THE INVENTION

The invention provides a composite-layer semiconductor device which alleviates the shortcomings of the previous phototransistor and conventional MESFETs. According to the principles of the invention, the molecular beam epitaxy, MBE, or metal organic chemical vapor deposition, MOCVD, growth and processing procedures are different than in the previous phototransistor procedure. The MBE or MOCVD growth sequence begins by growing an aluminum arsenide (AlAs) or aluminum gallium arsenide (AlGaAs) stop-etch layer, approximately 0.5 to 1 micron thick, on a single crystal semi-insulating GaAs substrate. A highly doped, electrically conductive n++ layer, approximately 0.5 to 1 micron thick with a carrier concentration, $n_d$, of $n_d > 2 \times 10^{19}$ carriers/$cm^3$, is grown on the stop-etch layer. Then an n-type GaAs layer, 0.5 to 1.5 microns thick, with an $n_d = 1$ to 2 carriers/$cm^3$, is grown on the n++ GaAs layer. This layer may be graded, e.g., starting the growth with $n_d=1\times10^{17}$ carriers/cm$^3$ and increasing to $n_d=3\times10^{17}$ carriers/cm$^3$. The grading of the growths may be modified depending upon the desired operating characteristics predicted by conventional modeling techniques. Following this growth a long wavelength, light absorbing, indium gallium arsenide, InGaAs, layer is grown. The thickness and grading of this layer can be predicted by modeling results. The last growth is a repeat of the first n-type GaAs layer. The thickness and grading of the last-grown n-type GaAs layer may vary depending on modeling results.

The growth structure and sequence can be modified as predicted by well known computer generated modeling technology to precisely predict the optimum layer structure for the desired operational characteristics of the resulting device. The optimum layer structure may result in a quantum well configuration as predicted from the modeling results.

Following the last n-type GaAs growth, a Schottky barrier gate is defined using conventional photolithographic procedures, and a titanium/platinum/gold, Ti/Pt/Au, mixture, or a mixture of refractory metals, is evaporated on the last-grown n-type GaAs layer. The gate length, i.e., the length of the gate between the source and drain, is 0.5 to 0.7 microns.

A significant feature of the improved composite-layer semiconductor device for use as a MESFET or phototransistor is that at this point in the process procedure the GaAs/InGaAs/GaAs structure, with the Schottky barrier gate formed on the surface, is now bonded, gate side down, onto an arbitrary substrate using thermally-conductive, electrically-insulative epoxy. The semi-insulating GaAs substrate is then mechanically thinned to approximately 100 microns. Reactive ion etching, RIE, using $CCl_2F_2$, or equivalent, is used to remove the remaining GaAs substrate to the AlAs stop-etch layer. A wet chemical etch consisting of 10 hydrogen peroxide/90 ammonium hydroxide, $10H_2O_2/90NH_4OH$, may also be used to etch the remaining GaAs substrate stopping at the AlAs layer. Hydrochloric acid, HCl, is used to selectively remove the AlAs stop-etch layer.

Mesa areas in photoresist are then formed and registered to the gate using an infrared, IR, mask aligner which permits precision front to back alignment by seeing through the growth structure and the arbitrary substrate. Device isolating mesas are etched to the arbitrary substrate using phosphoric acid/hydrogen peroxide/water, $H_3PO_4/H_2O_2/H_2O$, or equivalent. Ohmic source and drain contacts are now formed and alloyed on the exposed n++ GaAs contact layer, on the opposite side of the gate. The source and drain geometry is such that an opening, equivalent to the length and width of the underlying gate between the source and drain is precisely located over the gate. The source and drain metallization provides an etch barrier to permit chemical removal of the n++ GaAs contact layer and permits precise tailoring of the first-formed n-type GaAs layer for optimum operational characteristics of the resulting device, or devices if the process procedure is employed in wafer-scale fabrication.

The area above the gate can be incrementally recessed toward the gate in repeated steps to precisely fine tune the device for depletion or enhancement modes of operation.

In an illustrative embodiment, the composite-layer semiconductor device is ninety-percent depleted by this technique. This technique also considerably reduces the carrier transit time from the source to the drain as well as the RC constants associated with the semiconductor device. This improves the high speed characteristics of MESFET and phototransistor semiconductor devices embodying the invention.

A microlens having a circular, elliptical, or rectangular configuration in a top plan view of the backside of the semiconductor device can be used to capture and direct light from a laser or other light source into the current path of the semiconductor device. The microlens can be integral with the current path over a portion of the exposed backside of the semiconductor device.

Microlens fabrication includes reflowing (i.e., controlled melting) of poly(dimethylgluterimide) ("PMGI") or equivalent, a deep ultraviolet (UV) photoresist. PMGI is spin coated on the polished backside of the composite-layer semiconductor device. An imaging layer of conventional positive photoresist is spin coated on the backside of the composite-layer semiconductor device. The conventional positive photoresist is patterned using an infrared mask aligner to precisely align the lens on the backside at a central gate location over the gate of the semiconductor device. The PMGI is exposed to deep UV radiation using the patterned positive photoresist as a portable conformal mask that is opaque to deep UV radiation. The exposed PMGI is then developed away and the positive photoresist is removed using acetone. The resultant structure is an elongated rectangular block of PMGI disposed along the length of the gate.

The elongated rectangular block of PMGI is reflowed at a temperature of 300° C. for 5–15 minutes, depending on the thickness of the PMGI. Near-parabolic cross-sectional shapes of reflowed PMGI are obtained and create the microlens on the backside of the composite-layer semiconductor device.

If the surface of the microlens is metallized, and a slit opening for light entry preserved without metallization in the surface, a resonant cavity configuration can be achieved to capture all of the light from the laser or other light source. Such an arrangement could demonstrate 100% quantum efficiency. It is contemplated that the principles of the invention are applicable to InP-based phototransistors.

Other features and advantages of the invention will become apparent from the following detailed description of the preferred embodiment taken in conjunction with the accompanying drawing, which illustrate, by way of example, the features of the invention.

DETAILED DESCRIPTION OF THE PREFERRED EMBODIMENT

Figure 1:
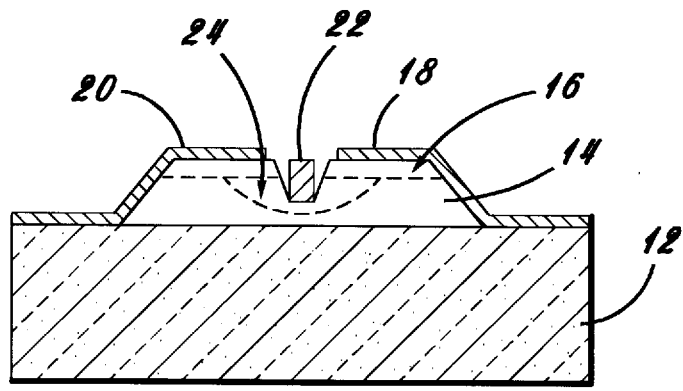
FIG. 1 illustrates a conventional GaAs MESFET.
Figure 2:
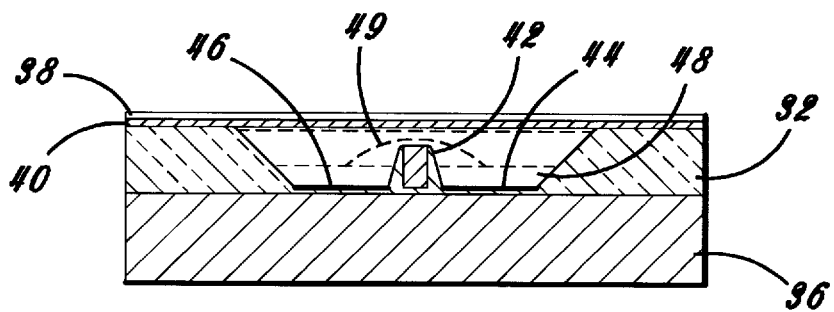
FIG. 2 illustrates a previous phototransistor design.

In this description, "top" or "upper" are relative to the substrate and refer to regions that are away from the substrate, whereas "bottom" and "lower" are relative terms meaning toward the substrate.

As shown in the drawings for purposes of illustration, a process for fabricating a composite-layer semiconductor device according to the principles of the invention enables a current channel above a gate of the semiconductor device to be incrementally recessed toward the gate in repeated steps to precisely adjust the device for depletion or enhancement mode applications. The process involves inverting a FET-type structure, removing the exposed semi-insulating GaAs substrate, and depositing source and drain contacts on an exposed GaAs n++ grown layer. The invention reduces the carrier transit time from the source to the drain and the RC constants associated with the semiconductor device. The semiconductor device according to the principles of the invention can be tailored after fabrication by recessing the active layer region between the source and drain to form depletion or enhancement operation modes, to improve the high speed characteristics of MESFET and phototransistor embodiments of the invention.

Figure 3:
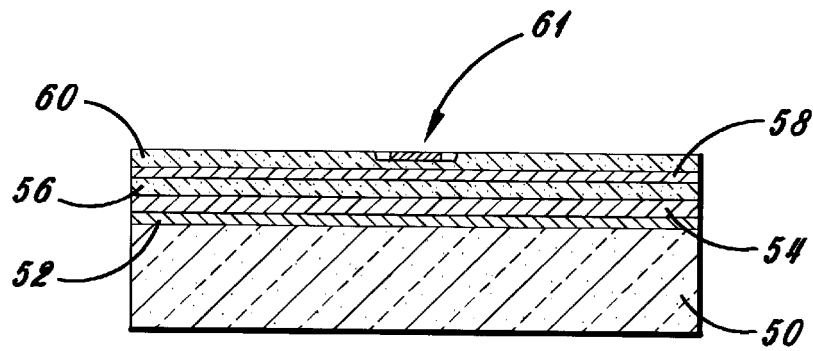
FIGS. 3–8 illustrate a process procedure for fabricating a composite-layer semiconductor device according to the principles of the invention.

Referring to FIG. 3, the processing procedure for fabricating the composite-layer semiconductor device is described. The active layers are grown on a semi-insulating (SI) substrate 50 by MBE or metal organic chemical vapor deposition ("MOCVD").

In the growth or deposition sequence, an AlAs or AlGaAs stop-etch layer 52 is formed on the SI single-crystal GaAs substrate 50. The stop-etch layer 52 is approximately 0.5 to 1 micron thick. An n++ GaAs contact layer 54 is formed above the AlAs or AlGaAs stop-etch layer 52. The n++ GaAs contact layer 54 is approximately 0.5 to 1 micron thick with a carrier concentration, $n_d$, of $n_d > 2 \times 10^{19}$ carriers/cm$^3$. A first n-type GaAs active layer 56 is formed above the n++ GaAs contact layer 54. The first n-type GaAs active layer 56 is approximately 0.5 to 1.5 microns thick, with an $n_d=1$ to 2 carriers/cm$^3$. This layer may be graded, e.g., starting the growth with $n_d=1\times10^{17}$ carriers/cm$^3$ and increasing to $n_d=3\times10^{17}$ carriers/cm$^3$. The grading of the growths may be modified depending upon the desired operating characteristics predicted by conventional modeling techniques. An n-type InGaAs absorption layer 58 is formed above the n-type GaAs active layer 56. The thickness and grading of the absorption layer 58 can be predicted by modeling. A second n-type GaAs active layer 60 is formed above the n-type InGaAs absorption layer 58. The second n-type GaAs Active layer 60 is approximately 0.5 to 1.5 microns thick, with an $n_d=1$ to 2 carriers/cm$^3$.

The growth structure and sequence can be modified as predicted by well known computer generated modeling technology to precisely predict the optimum layer structure for the desired operational characteristics of the resulting device. The optimum layer structure may result in a quantum well configuration as predicted from the modeling results.

The composition and thickness of these epitaxially grown or deposited layers in the sequence can be varied to achieve a broad bandwidth for the composite-layer semiconductor device. The composite-layer semiconductor device produced preferably has a broadband photoresponse incorporating the photoresponse of both GaAs and InP, i.e., the photoresponse is in a range from 0.6 to 1.5 mm wavelength. This photoresponse is much broader than the photoresponse of the previous phototransistor invented by Gerald D. Robinson or a conventional GaAs MESFET.

Figure 4:
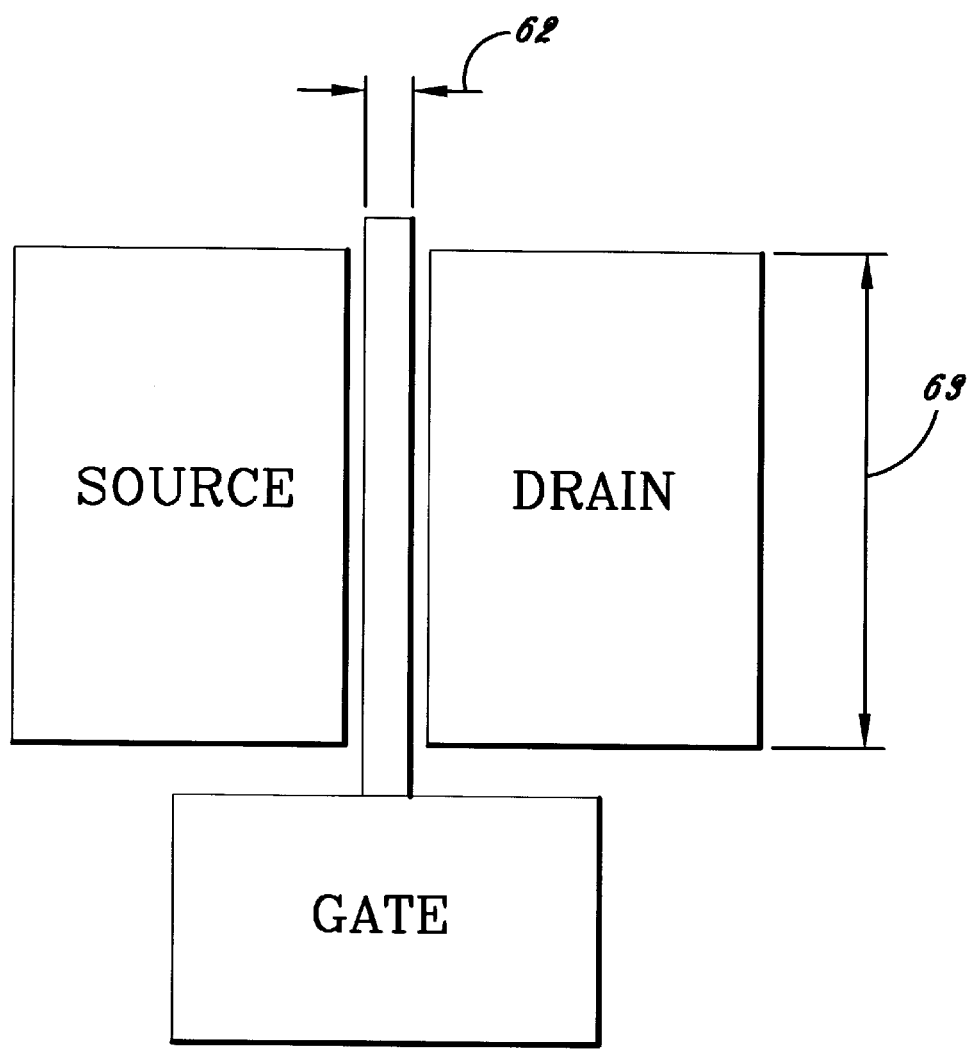

Conventional photolithography is performed to define the Schottky Barrier ("SB") gate 61 area in the second n-type GaAs layer 60. The SB gate 61 is deposited, for example, using an unalloyed mixture of Ti, Pt, and Au; or, a mixture of refractory metals such as Ge, Mo, and W. As shown in FIG. 4, the gate length 62 (i.e., the length of the gate between the source and drain) is in a range from 0.5 to 0.7 microns. The gate width 63 is in a range from 5 to 15 microns.

Figure 5:
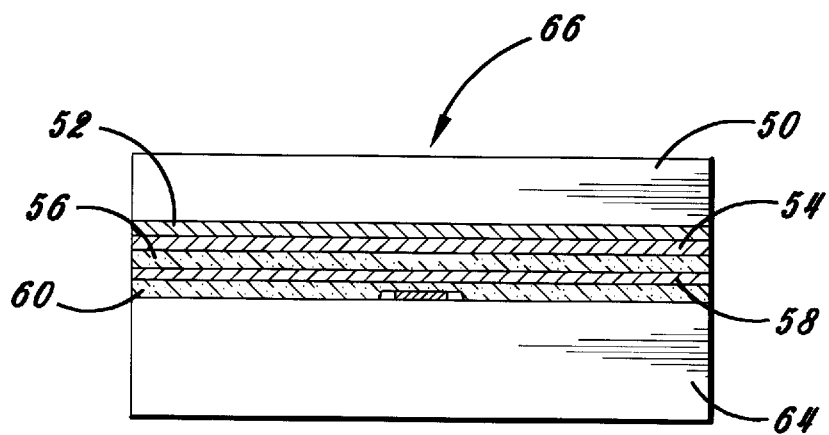

Referring to FIG. 5, the unitary layers 52–60 which are integrally mounted on the substrate 50, are flipped. The unitary layers and substrate are then bonded, gate side down, to an arbitrary host substrate 64 using thermally-conductive electrically-insulative high temperature epoxy between second n-type GaAs layer 60 and host substrate 64. In this configuration, SI substrate 50 is now above unitary layers 52–60 with respect to arbitrary host substrate 64 and presents an exposed backside 66. The arbitrary host substrate can consist of, for example, AlN, Al$_2$O$_3$, or sapphire.

Figure 6:
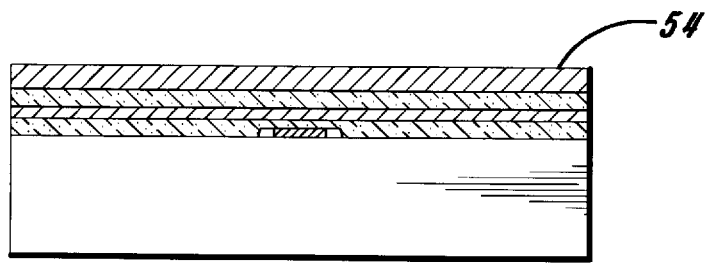

The exposed backside 66 (FIG. 5) of SI substrate 50 is mechanically thinned. The remaining portion of exposed backside 66 of substrate 50 is removed using Reactive Ion Etching ("RIE") with Freon 12, CCl$_2$F$_2$, or equivalent, etchant gas. RIE for substrate removal is stopped at AlAs (or AlGaAs) stop-etch layer 52. Such stop-etch layer 52 is removed with dilute hydrochloric acid (HCl) to form the structure shown in FIG. 6 which presents n++ contact layer 54 on the exposed backside.

Figure 7:
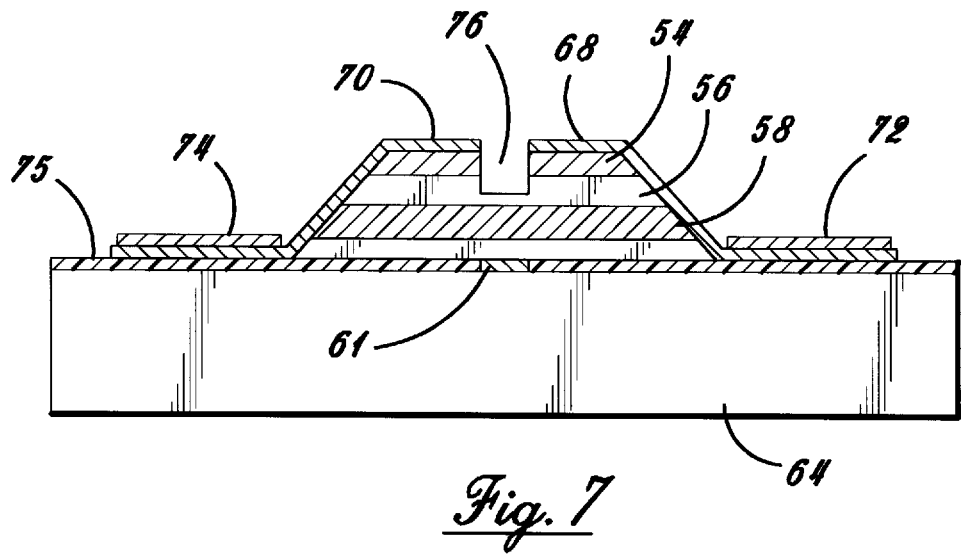

Referring to FIG. 7, the composite-layer semiconductor device is isolated by photolithographically defining and wet etching a mesa to arbitrary host substrate 64. Ohmic contact regions 68, 70 are photolithographically defined as the source and the drain. These ohmic contacts extend continuously down the sides of the mesa to arbitrary substrate 64. Unalloyed Ti/Pt/Au source and drain bonding contacts 72, 74 are deposited thereon as a secondary metal after the ohmic metal to permit wire bonding. Because highly-doped n++ GaAs contact layer 54 is used, alloyed contacts for the source 68 and drain 70 are not required. This ensures the integrity of the epoxy 75, and is an improvement over the previous phototransistor invented by Gerald D. Robinson.

The deposited source and drain ohmic contacts 68, 70 form a barrier to etching such that the current path in the top (formerly the first) n-type GaAs layer 56 above gate 61 may be chemically recessed through repeated incremental steps to precisely tailor the operating characteristics of the semiconductor device for depletion or enhancement modes.

After a preselected etch depth into an unmasked portion of the exposed backside at a central gate location 76, the exposed backside above the current path in top n-type GaAs layer 56 at central gate location 76 is etched to incrementally decrease the vertical dimension of the top n-type GaAs layer to form a depletion or enhancement type device, or to modify the Idss or the pinch-off voltage of the device.

This ability to tailor the current path in top n-type GaAs layer 56 (FIG. 7) by adjusting the vertical dimension of the top n-type GaAs layer is an important principle of the invention, previously unknown to those skilled in the art. This aspect of the invention is useful whether the composite-layer semiconductor device is to be used as a MESFET switch or as a photosensitive MESFET transducer.

Figure 8:
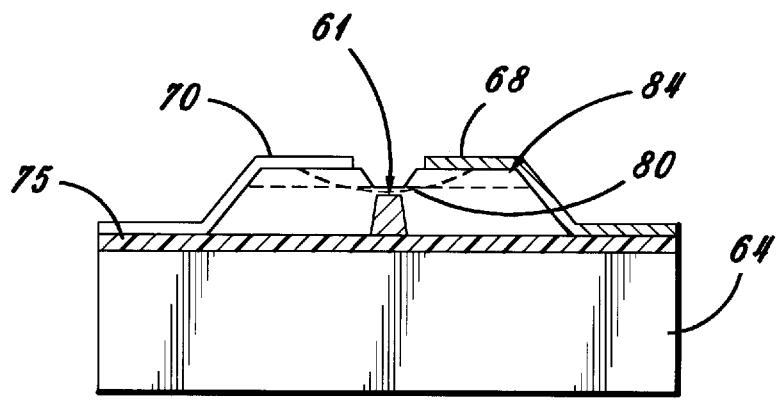

The transit distance traveled by carriers through the current path 80, as shown in FIG. 8, in top n-type GaAs layer 56 (FIG. 7) from source 68 to drain 70 is significantly reduced according to this technique. This reduces performance-limiting RC constants in the device. The reduction of RC constants in the device dramatically increases the performance of the semiconductor device embodied as a MESFET or as a phototransistor.

The transit distance, according to the principles of the invention, amounts merely to the current path 80 through top n-type GaAs layer 56 (FIG. 7) between the source and the drain above gate 61. As a result, the maximum operating speed and gain of the composite-layer semiconductor device are substantially increased.

Referring to FIG. 8, a broadband high-speed composite-layer semiconductor device fabricated according to the process taught herein presents gate 61 secured to epoxy layer 75 above arbitrary host substrate 64. Source and drain ohmic contacts 68, 70 are applied to n++ contact layer 84. The source and drain ohmic contacts 68, 70 mark central gate location 76 (FIG. 7) which is recessed through n++ contact layer 84 into top n-type layer 56 (FIG. 7) toward gate 61. Current path 80, incrementally recessed to a selected depletion amount, in top n-type layer 56 below the recessed central gate location connects the source and drain above the gate.

Figure 9:
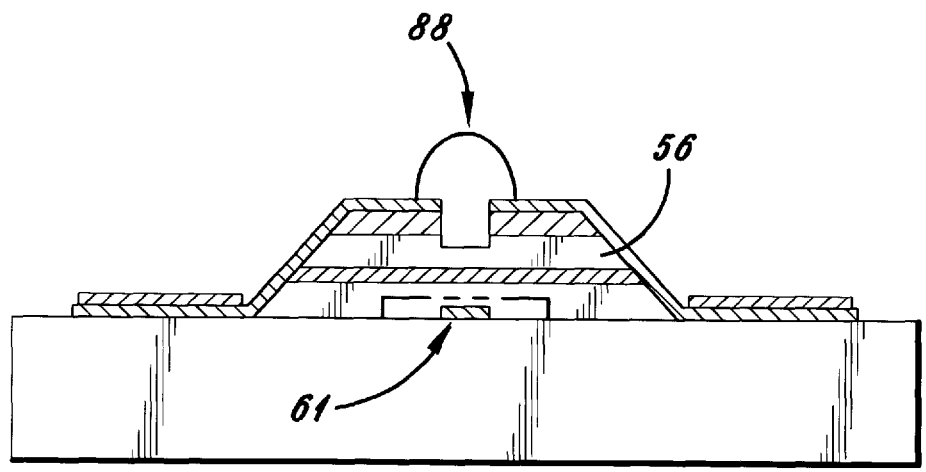
FIGS. 9–10 illustrate a process procedure for fabricating a microlens onto a composite-layer semiconductor device according to the principles of the invention.

Referring to FIG. 9, a microlens 88, having a circular, elliptical, or rectangular configuration in a top plan view of the fabricated composite-layer semiconductor device can be formed on recessed central gate location 76 (FIG. 7) on the backside of the composite-layer semiconductor device. Such a microlens effectively collects and directs light to current path 80 (FIG. 8) in the top n-type GaAs layer above the gate.

Figure 10:
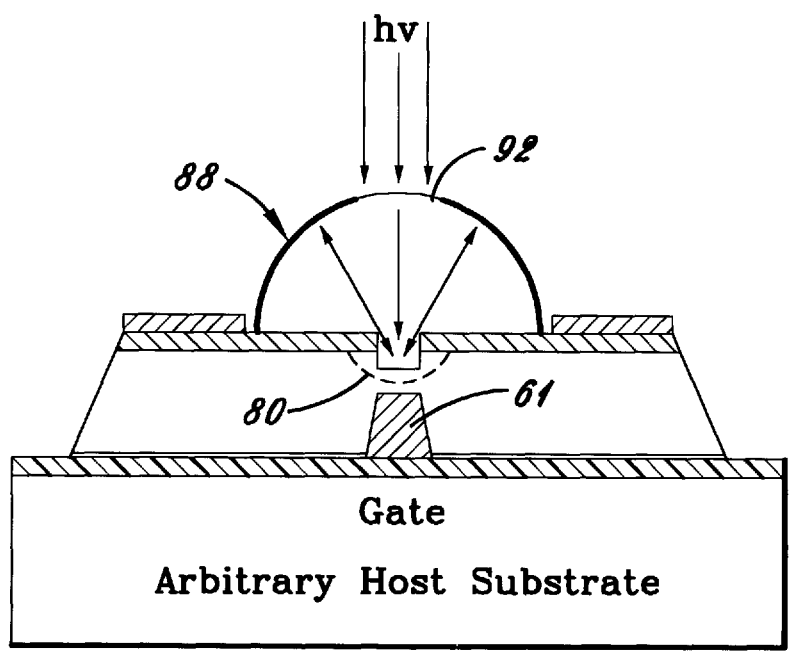

Referring to FIG. 10, the surface of microlens 88 can be metallized, and an unmetallized slit area 92 to allow light entry into the microlens, preserved in the surface of the microlens, to form a resonant light cavity. Such a metallized microlens could result in one-hundred percent quantum efficiency, wherein every photon received into the resonant light cavity generates an electron.

Microlenses can be fabricated in poly (dimethylgluterimide) ("PMGI") or an equivalent. A process procedure for fabricating PMGI microlenses, and integrating microlenses into vertical cavity lasers, is described in detail in copending U.S. application Ser. No. 08/635,798 entitled "VERTICAL CAVITY LASERS WITH MONOLITHICALLY INTEGRATED REFRACTORY MICROLENSES" filed Apr. 22, 1996 by Gerald D. Robinson, which is incorporated by reference as if fully set forth herein.

A rectangular block of PMGI, rather than a cylinder of PMGI as described in the above-referenced pending patent application Ser. No. 08/635,798, is used to create the microlens for collecting and directing impinging light toward the current path. The rectangle of PMGI is processed to cover the elongated recess along the length of the gate in the exposed backside, which provides a light entry-way to the gate. Microlens fabrication includes reflowing (i.e., controlled melting) of photoresist into a microlens having a parabolic cross-section. This microlens is transferred onto the backside of the composite-layer semiconductor device.

Poly(dimethylgluterimide) ("PMGI"), a deep ultraviolet (UV) photoresist, is used as the lens material. PMGI is spin coated on the polished backside of the composite-layer semiconductor device; note that many semiconductor devices can be manufactured in a wafer according to the principles of the invention. An imaging layer of conventional positive photoresist is spin coated on the backside. The conventional positive photoresist is patterned and precisely aligned with the gate. The PMGI is exposed to deep UV using the patterned positive photoresist as a portable conformal mask (PCM) that is opaque to deep UV radiation. The exposed PMGI is then developed away and the positive photoresist is removed using acetone. The resultant structure is an elongated rectangular block of PMGI having a length corresponding to the gate length.

The PMGI rectangular blocks at the central gate location are reflowed at a temperature of 300° C. for 5–15 minutes, depending on the thickness of the PMGI. Near-parabolic cross-sectional shapes of reflowed PMGI are obtained on the backside surface of the composite-layer semiconductor device.

Rectangular microlenses for the backside of a semiconductor device in accordance with the principles of the invention have been created having dimensions of approximately 5 mm by 25 mm.

Both concave and convex microlenses, with respect to the current path at the central gate location, can be fabricated on the exposed backside and incorporated into the semiconductor device.

While several particular forms of the invention have been illustrated and described, it will also be apparent that various modifications can be made without departing from the spirit and scope of the invention.

What is claimed is:

1. A process of fabricating a broadband high-speed composite-layer semiconductor device, comprising the following steps:

(A) depositing a gate onto an n++ contact layer above a semi-insulating substrate;

(B) flipping the semi-insulating substrate and gate onto an epoxy layer on a host substrate so that the gate is secured to the epoxy layer and the semi-insulating substrate presents an exposed backside;

(C) removing discrete areas of the exposed backside to form one or more mesas;

(D) applying source and drain ohmic contacts to the exposed backside above the n++ contact layer; and (E) recessing the exposed backside at a central gate location to define a current path which connects the source and drain ohmic contacts.

2. The process of claim 1, wherein step (A) includes the step:

recessing the gate through the n++ contact layer.

3. The process of claim 1, wherein step (C) includes the step:

photolithographically defining and wet-etching a mesa to the host substrate.

4. The process of claim 1, wherein:

the gate includes a mixture of Ti, Pt, and Au.

5. The process of claim 1, wherein:

the gate includes a mixture of Ge, Mo, and W.

6. The process of claim 1, wherein:

the device has a broadband photoresponse which is in a wavelength range from 0.6 to 1.5 microns.

7. The process of claim 1, wherein:

the epoxy layer is thermally-conductive and electrically-insulative.

8. The process of claim 1, further comprising the step:

forming a microlens on the exposed backside at the central gate location to direct light toward the current path.

9. The process of claim 8, wherein:

the microlens is integral with the current path.

10. The process of claim 8, further comprising the step:

forming a resonant optical cavity by metallizing a portion of the surface of the microlens.

11. The process of claim 1, wherein:

the current path is tailored for at least 90% depletion.

12. The process of claim 1, wherein step (E) includes the step:

chemically etching the exposed backside to reduce the vertical dimension of the current path at the central gate location.

13. The process of claim 1, further comprising the step:

creating a barrier to chemical etching on the exposed backside such that the current path can be chemically recessed to tailor the device for depletion or enhancement modes of operation.

* * * * *